(12) United States Patent
Kanemaki et al.

(10) Patent No.: US 9,756,749 B2
(45) Date of Patent: Sep. 5, 2017

(54) ELECTRONIC APPARATUS

(71) Applicant: KYOCERA Corporation, Kyoto-shi, Kyoto (JP)

(72) Inventors: Yasuhito Kanemaki, Katano (JP); Tomoki Tsuchiya, Osaka (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 15/002,770

(22) Filed: Jan. 21, 2016

(65) Prior Publication Data

US 2016/0157370 A1 Jun. 2, 2016

Related U.S. Application Data

(63) Continuation of application No. PCT/JP2014/067159, filed on Jun. 27, 2014.

(30) Foreign Application Priority Data

Jul. 22, 2013 (JP) .................................. 2013-151598

(51) Int. Cl.
*H04M 1/03* (2006.01)
*H05K 5/03* (2006.01)
(Continued)

(52) U.S. Cl.
CPC ................ *H05K 5/03* (2013.01); *H04M 1/03* (2013.01); *H04R 7/045* (2013.01); *H04R 17/00* (2013.01);
(Continued)

(58) Field of Classification Search
CPC ............ H05K 5/03; H04M 1/03; H04R 7/045
See application file for complete search history.

(56) References Cited

U.S. PATENT DOCUMENTS 9,191,748 B2 * 11/2015 Nabata .................. H04M 1/035
9,313,306 B2 * 4/2016 Hosoi .................... H04M 1/035
(Continued)

FOREIGN PATENT DOCUMENTS

JP 2011-061316 A 3/2011

OTHER PUBLICATIONS

International Search Report and Written Opinion of the International Searching Authority issued by the Japanese Patent Office for International Application No. PCT/JP2014/067159.

*Primary Examiner* — Hoa C Nguyen
*Assistant Examiner* — Keith Depew
(74) *Attorney, Agent, or Firm* — Procopio Cory Hargreaves and Savitch LLP (57) ABSTRACT

An electronic apparatus is disclosed. In one embodiment, an electronic apparatus comprises a display, a cover member, a piezoelectric vibrating element, a controller, a housing, a bonding material, and an intervening member. The bonding material between the housing and a peripheral end of an inner surface of the cover member is configured to bond the housing and the cover member. The inner surface of the cover member includes a partial region in which the bonding material is absent. The partial region includes a region in which the piezoelectric vibrating element is located and extends to one part of a periphery of the inner surface. The intervening member is located between the housing and a region of the partial region close to the one part of the periphery relative to the piezoelectric vibrating element and is less likely to interfere with a vibration of the cover member than the bonding material.

6 Claims, 10 Drawing Sheets

(51) Int. Cl.
  *H04R 7/04*     (2006.01)
  *H04R 17/00*    (2006.01)
(52) U.S. Cl.
  CPC ...... *H04R 2217/01* (2013.01); *H04R 2460/13* (2013.01); *H04R 2499/11* (2013.01)

(56) References Cited

U.S. PATENT DOCUMENTS

| | | | | |
|---|---|---|---|---|
| 9,374,057 B2* | 6/2016 | Nabata | ................ | H04M 1/6016 |
| 9,467,773 B2* | 10/2016 | Inagaki | ................ | H04M 1/0266 |
| 9,496,842 B2* | 11/2016 | Sudo | ................ | H04R 17/00 |
| 9,497,536 B2* | 11/2016 | Otani | ................ | H04R 1/028 |
| 9,501,189 B2* | 11/2016 | Kono | ................ | G06F 3/0418 |
| 9,519,347 B2* | 12/2016 | Satake | ................ | G06F 3/0488 |
| 2006/0140438 A1* | 6/2006 | Kimura | ................ | H04M 1/03 381/431 |
| 2006/0140439 A1* | 6/2006 | Nakagawa | ................ | H04M 1/0266 381/431 |
| 2006/0227981 A1* | 10/2006 | Miyata | ................ | G02F 1/133 381/124 |
| 2010/0061584 A1* | 3/2010 | Lin | ................ | H04R 1/02 381/386 |
| 2010/0225600 A1* | 9/2010 | Dai | ................ | G06F 3/016 345/173 |
| 2013/0038561 A1* | 2/2013 | Ujii | ................ | H04M 1/02 345/173 |
| 2013/0241352 A1* | 9/2013 | Hayashi | ................ | H01L 41/0926 310/323.01 |
| 2013/0250502 A1* | 9/2013 | Tossavainen | ................ | G06F 3/016 361/679.01 |
| 2013/0259274 A1* | 10/2013 | Hayashi | ................ | H04M 1/03 381/190 |
| 2013/0285506 A1* | 10/2013 | Takeda | ................ | H02N 2/001 310/317 |
| 2013/0286572 A1* | 10/2013 | Tsurusaki | ................ | G06F 3/041 361/679.01 |
| 2013/0321321 A1* | 12/2013 | Hiraoka | ................ | G06F 3/016 345/173 |
| 2013/0335211 A1* | 12/2013 | Kobayashi | ................ | G06F 1/1626 340/407.2 |
| 2014/0064536 A1* | 3/2014 | Kim | ................ | G02B 27/017 381/333 |
| 2014/0145836 A1* | 5/2014 | Tossavainen | ................ | G06F 3/016 340/407.2 |
| 2015/0146914 A1* | 5/2015 | Guo | ................ | H04R 9/04 381/423 |
| 2015/0256656 A1* | 9/2015 | Horii | ................ | H04M 1/0202 455/575.1 |
| 2016/0127524 A1* | 5/2016 | Kanemaki | ................ | H04M 1/03 455/575.1 |

* cited by examiner

ELECTRONIC APPARATUS

CROSS-REFERENCE TO RELATED APPLICATION

The present application is a continuation based on PCT Application No. PCT/JP2014/067159, filed on Jun. 27, 2014, which claims the benefit of Japanese Application No. 2013-151598, filed on Jul. 22, 2013. PCT Application No. PCT/JP2014/067159 is entitled "ELECTRONIC APPARATUS," and Japanese Application No. 2013-151598 is entitled "ELECTRONIC APPARATUS". The contents of which are incorporated by reference herein in their entirety.

FIELD

Embodiments of the present disclosure relate to an electronic apparatus.

BACKGROUND

Various technologies have conventionally been proposed for electronic apparatuses.

SUMMARY

An electronic apparatus is disclosed. In one embodiment, an electronic apparatus comprises a display, a cover member, a piezoelectric vibrating element, a controller, a housing, a bonding material, and an intervening member. The cover member is located on a surface of the electronic apparatus and is configured to cover a display surface of the display. The piezoelectric vibrating element is located on an inner surface of the cover member. The piezoelectric vibrating element is located between the display and a periphery of the inner surface in a plan view. The controller is configured to cause the piezoelectric vibrating element to vibrate based on a sound signal. The cover member is attached to the housing. The bonding material is located between the housing and a peripheral end of the inner surface of the cover member and is configured to bond the housing and the cover member to each other. The inner surface of the cover member includes a partial region in which the bonding material is absent. The partial region includes a region in which the piezoelectric vibrating element is located and extends to one part of the periphery of the inner surface. The intervening member is located between the housing and a region of the partial region close to the one part of the periphery relative to the piezoelectric vibrating element and is less likely to interfere with a vibration of the cover member than the bonding material.

DETAILED DESCRIPTION

\<External Appearance of Electronic Apparatus\>

Figure 1:
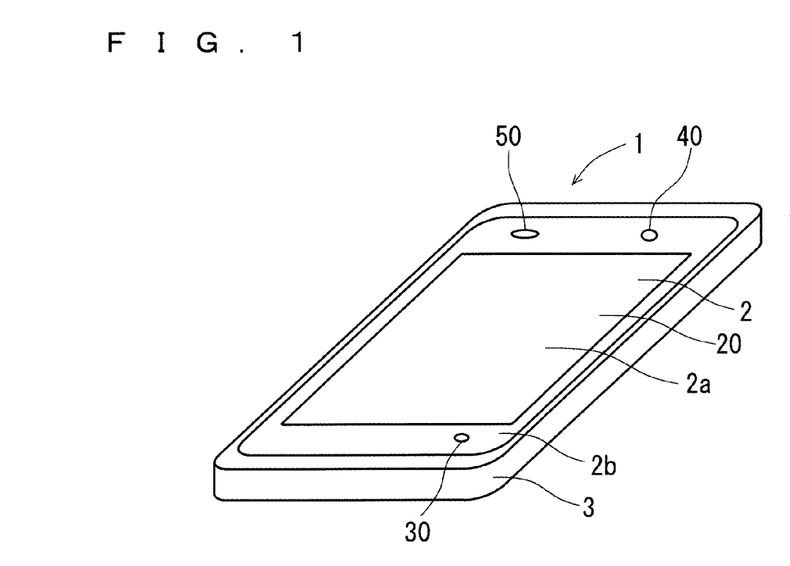
FIG. 1 illustrates a perspective view showing an external appearance of an electronic apparatus according an embodiment.
Figure 2:
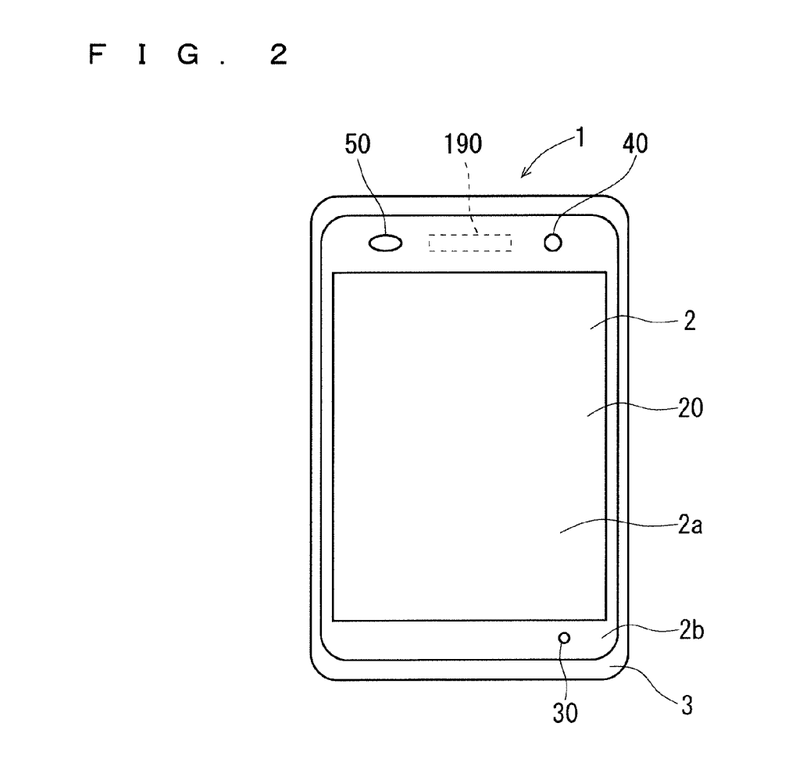
FIG. 2 illustrates a front view showing the external appearance of the electronic apparatus according to an embodiment.
Figure 3:
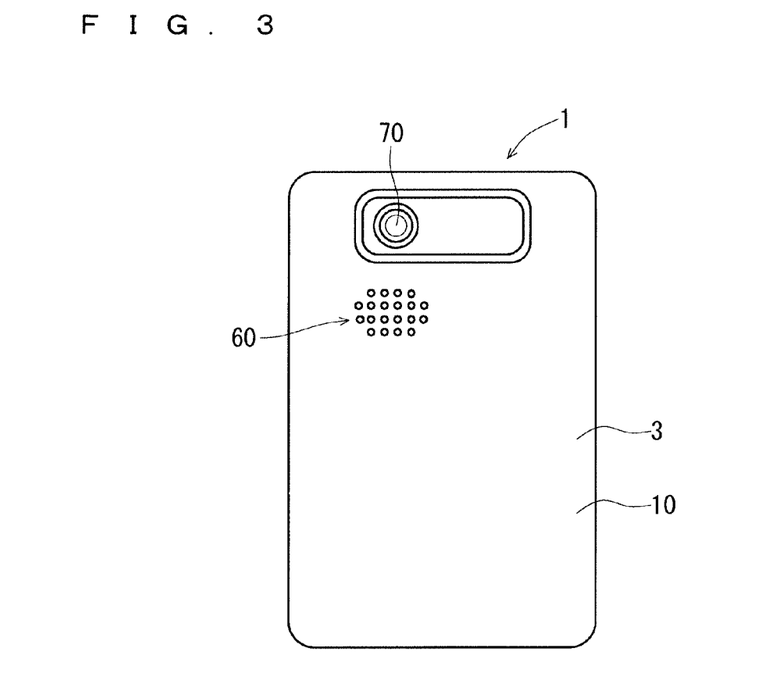
FIG. 3 illustrates a rear view showing the external appearance of the electronic apparatus according to an embodiment.
Figure 4:
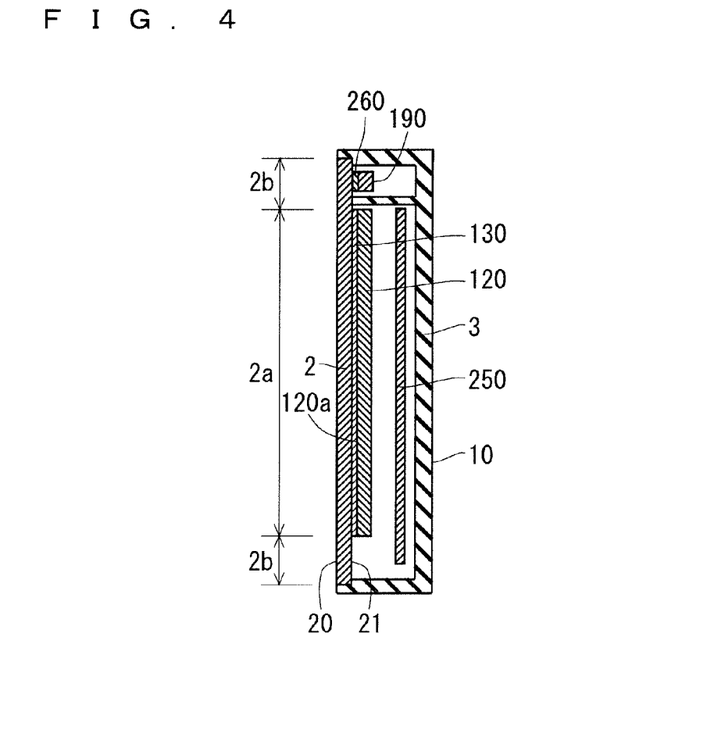
FIG. 4 illustrates a sectional structure of the electronic apparatus according to an embodiment.
Figure 5:
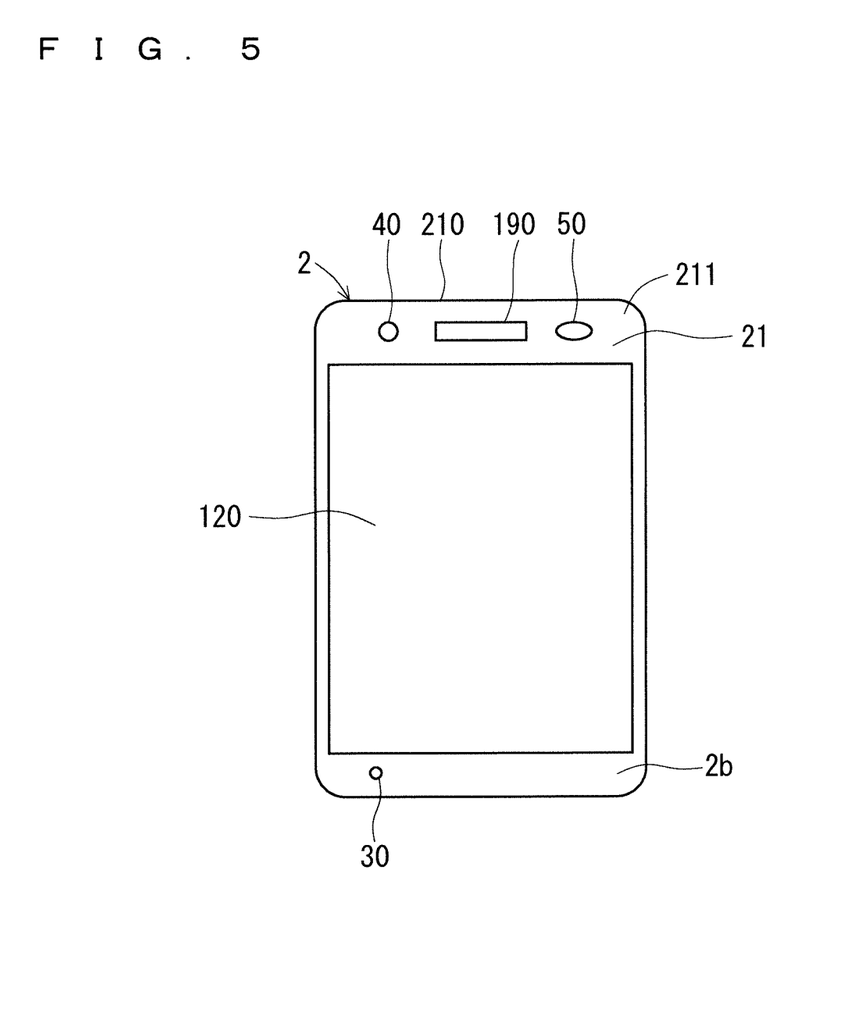
FIG. 5 illustrates a plan view showing a cover member when seen from its inner surface side.

FIGS. 1 to 3 are a perspective view, a front view, and a rear view, respectively, showing the external appearance of an electronic apparatus 1 according to one embodiment. FIG. 4 is a schematic view showing the sectional structure of the electronic apparatus 1 in the vertical direction (the longitudinal direction). FIG. 5 is a rear view of a cover member 2 of the electronic apparatus 1. The cover member 2 illustrated in FIG. 5 is provided with a piezoelectric vibrating element 190 and a display panel 120 of the electronic apparatus 1. The electronic apparatus 1 according to one embodiment is, for example, a mobile phone.

As illustrated in FIGS. 1 to 5, the electronic apparatus 1 includes the cover member (also referred to as a cover panel) 2 that covers a display surface 120a of the display panel 120 (FIG. 4) and a housing 3 that accommodates respective elements such as the display panel 120 and the like of the electronic apparatus 1. The cover member 2 and the housing 3 are combined, so that the electronic apparatus 1 has an approximately rectangular plate shape in a plan view.

The cover member 2 has a plate shape. In plan view, the cover member 2 has an approximately rectangular shape. The cover member 2 forms the front portion, except the peripheral end (peripheral portion) of the front portion, of the electronic apparatus 1. The cover member 2 is made of a material that is transparent and relatively hard. Such material may be, for example, glass (tempered glass) or sapphire (artificial sapphire). Here, sapphire is made of aluminum oxide (AlO3) crystals and industrially manufactured. Sapphire may be a single crystal or a polycrystal as long as it is transparent. A sapphire single crystal refers to an alumina (Al2O3) single crystal and, herein, refers to a single crystal having a purity of Al2O3 of approximately 90% or more. The purity of Al2O3 is preferably equal to or greater than 99% which provides a greater resistance to damage of the cover member and more reliably eliminates or reduces cracks or chipping. The cover member 2 may be made of an acrylic resin.

The housing 3 has an approximately rectangular parallelepiped shape with one of its surfaces being partially open. The housing 3 forms the peripheral end of the front portion, the side portion, and the rear portion of the electronic apparatus 1. The housing 3 is made of, for example, resin. The resin forming the housing 3 may be, for example, a polycarbonate resin, an ABS resin, or a nylon-based resin. The housing 3 may include a single member or a plurality of members combined therein.

The cover member 2 includes a transparent display portion (also referred to as a display window) 2a transmitting the display of the display panel 120. The display portion 2a has, for example, a rectangular shape in a plan view. The visible light output from the display panel 120 passes through the display portion 2a and is emitted to the outside of the electronic apparatus 1. The user visually recognizes information displayed on the display panel 120 through the display portion 2a from the outside of the electronic apparatus 1.

The major portion of a peripheral end (peripheral portion) 2b of the cover member 2 that surrounds the display portion 2a is opaque and/or not transparent because of, for example, a film or the like is attached thereto. Accordingly, the major portion of the peripheral end 2b is a non-display portion that does not transmit the display of the display panel 120.

As illustrated in FIG. 4, a touch panel 130 is attached to an inner surface 21 of the cover member 2. The display panel 120 being a display is attached to the surface opposite to the inner surface 21 side of the touch panel 130. That is, the display panel 120 is installed on the inner surface 21 of the cover member 2 with the touch panel 130 therebetween. A portion of the cover member 2 facing the display panel 120 is the display portion 2a. The user can provide various instructions to the electronic apparatus 1 by operating the display portion 2a of the cover member 2 using the finger or the like. The display panel 120 may be attached to the touch panel 130 with a sponge therebetween.

Provided in the inside of the housing 3 is a printed circuit board 250 in which various components such as a Central Processing Unit (CPU) 101 and a Digital Signal Processor (DSP) 102, which will be described below, are mounted. The printed circuit board 250 is disposed between the display panel 120 and a rear surface 10 of the electronic apparatus 1 (the rear surface of the housing 3) so as to face the display panel 120.

As illustrated in FIGS. 1, 2, and 5, provided in the lower end of the cover member 2 is a microphone hole 30. As illustrated in FIG. 3, provided on the rear surface 10 of the electronic apparatus 1, in other words, on the rear surface of the housing 3, are speaker holes 60.

Provided in the inside of the housing 3 are a proximity sensor 140, a front imaging unit 160, a rear imaging unit 170, and the piezoelectric vibrating element 190, which will be described below. As illustrated in FIGS. 2, 4, and 5, the piezoelectric vibrating element 190 is attached to the inner surface 21 of the cover member 2 with a bonding material 260. Provided at the upper end of the cover member 2 is a proximity-sensor transparent part 50, through which the proximity sensor 140 in the housing 3 is visually recognized from the outside of the electronic apparatus 1. The proximity sensor 140 is mounted to the proximity-sensor transparent part 50 from the inner side thereof. Further, provided at the upper end of the cover member 2 is a front-surface-lens transparent part 40, through which an imaging lens of the front imaging unit 160 in the housing 3 is visually recognized from the outside of the electronic apparatus 1. The imaging lens of the front imaging unit 160 is mounted to the front-surface-lens transparent part 40 from the inner side thereof. Provided on the rear surface 10 of the electronic apparatus 1 is a rear-surface-lens transparent part 70, through which an imaging lens of the rear imaging unit 170 in the housing 3 is visually recognized from the outside of the electronic apparatus 1. The imaging lens of the rear imaging unit 170 is mounted to the rear-surface-lens transparent part 70 form the inner side thereof.

<Electrical Configuration of Electronic Apparatus>

Figure 6:
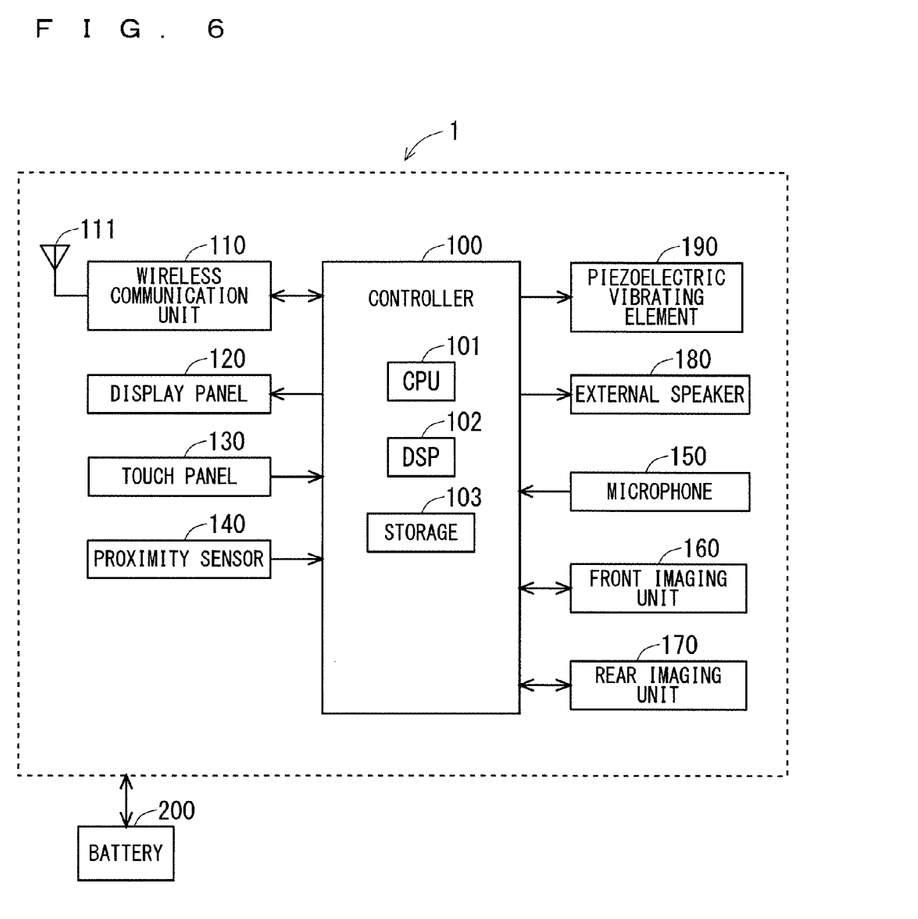
FIG. 6 illustrates an electrical configuration of the electronic apparatus according to an embodiment.

FIG. 6 is a block diagram mainly illustrating the electrical configuration of the electronic apparatus 1. As illustrated in FIG. 6, the electronic apparatus 1 includes a controller 100, a wireless communication unit 110, the display panel 120, the touch panel 130, and the proximity sensor 140. The electronic apparatus 1 further includes a microphone 150, the front imaging unit 160, the rear imaging unit 170, an external speaker 180, the piezoelectric vibrating element 190, and a battery 200. The housing 3 accommodates the respective elements, except for the cover member 2, of the electronic apparatus 1.

The controller 100 includes the Central Processing Unit (CPU) 101, the Digital Signal Processor (DSP) 102, and a storage 103. The controller 100 can manage the overall operation of the electronic apparatus 1 by controlling other elements of the electronic apparatus 1. The storage 103 is, for example, a Read Only Memory (ROM) or a Random Access Memory (RAM). A main program, a plurality of application programs, and the like are stored in the storage 103, the main program being a control program for controlling the electronic apparatus 1, specifically, for controlling respective elements such as the wireless communication unit 110, the display panel 120, and the like of the electronic apparatus 1. Various functions of the controller 100 can be enabled by the CPU 101 and the DSP 102 by executing various programs in the storage 103.

The wireless communication unit 110 includes an antenna 111. In the wireless communication unit 110, the antenna 111 can receive a signal from a mobile phone different from the electronic apparatus 1, or from a communication device such as a web server connected to the Internet via a base station. The wireless communication unit 110 can perform an amplification process and down conversion on the received signal and output the signal to the controller 100. The controller 100 can perform demodulation processing or the like on the input signal, and acquire a sound signal (sound information) indicating a voice or music included in the received signal.

The wireless communication unit 110 can perform up-converting and the amplification process on a transmission signal including a sound signal or the like generated in the controller 100, and wirelessly transmit the transmission signal after the process from the antenna 111. The transmission signal from the antenna 111 can be received in a communication device connected to the Internet or a mobile phone different from the electronic apparatus 1 via the base station.

The display panel 120 being a display is, for example, a liquid crystal display panel or an organic electro luminescent (EL) panel. The display panel 120 can display various pieces of information such as characters, symbols, and figures by control of the controller 100. The information displayed in the display panel 120 can be visually recognized by the user of the electronic apparatus 1 through the display portion 2a of the cover member 2.

The touch panel 130 is, for example, a projection type electrostatic capacitance touch panel. The touch panel 130 can detect contact of an object with respect to the display portion 2a of the cover member 2. The touch panel 130 is attached to the inner surface of the cover member 2. The touch panel 130 includes two sheet-shaped electrode sensors opposed to each other. The two electrode sensors are bonded to each other through a transparent adhesive sheet.

Formed in one of the electrode sensors are a plurality of long and narrow X electrodes that extend along an X-axis direction (for example, the horizontal direction of the electronic apparatus 1) and are disposed parallel to one another. Formed in the other electrode sensor are a plurality of long and narrow Y electrodes that extend along a Y-axis direction (for example, the vertical direction of the electronic apparatus 1) and are disposed parallel to one another. When the finger or the like of the user contacts the display portion 2a of the cover member 2, the capacitance between the X electrode and the Y electrode below the contacted portion changes. Thus, the touch panel 130 can detect an operation (contact) of the cover member 2 with the display portion 2a. The touch panel 130 can generate an electrical signal indicating the capacitance change between the X electrode and the Y electrode and output the electrical signal to the controller 100. The controller 100 can specify the details of an operation performed on the display portion 2a of the cover member 2 based on the electrical signal and perform an operation according to the specified details.

The proximity sensor 140 is, for example, an infrared type proximity sensor. The proximity sensor 140 can output a detection signal when an object approaches the proximity sensor 140 within a predetermined distance. The detection signal is input to the controller 100. When the controller 100 receives the detection signal from the proximity sensor 140, for example, the controller 100 can stop a function of detecting an operation of the touch panel 130.

The front imaging unit 160 includes an imaging lens, an imaging element, and the like. The front imaging unit 160 can image a still image and a moving image based on the control by the controller 100. The imaging lens of the front imaging unit 160 can be visually recognized from the front-surface-lens transparent part 40 on the front surface of the electronic apparatus 1. Therefore, the front imaging unit 160 can image an object in front of the surface side (cover member 2 side) of the electronic apparatus 1.

The rear imaging unit 170 includes an imaging lens, an imaging element, and the like. The rear imaging unit 170 can image a still image and a moving image based on the control by the controller 100. The imaging lens of the rear imaging unit 170 can be visually recognized from the rear-surface-lens transparent part 70 on the rear surface 10 of the electronic apparatus 1. Therefore, the rear imaging unit 170 can image an object in front of the rear surface 10 side of the electronic apparatus 1.

The microphone 150 can output a sound from the outside of the electronic apparatus 1 to the controller 100 by converting the sound into an electric sound signal. The sound from the outside of the electronic apparatus 1 is received by the microphone 150 through the microphone hole 30 provided on the front surface of the cover member 2. The microphone hole 30 may be provided on the side surface of the electronic apparatus 1 or may be provided on the rear surface 10.

The external speaker 180 is, for example, a dynamic speaker. The external speaker 180 can convert an electric sound signal from the controller 100 into a sound and then output the sound. The sound output from the external speaker 180 is output from the speaker holes 60 provided on the rear surface 10 of the electronic apparatus 1 to the outside. The volume of the sound output from the speaker holes 60 can be set to a degree such that the sound can be heard at a location separated from the electronic apparatus 1.

As described above, the piezoelectric vibrating element 190 is attached to the inner surface 21 of the cover member 2 disposed on the front surface of the electronic apparatus 1 with the bonding material 260. The piezoelectric vibrating element 190 can be vibrated by a drive voltage provided from the controller 100. The controller 100 can generate a drive voltage based on a sound signal, and provide the drive voltage to the piezoelectric vibrating element 190. The piezoelectric vibrating element 190 is vibrated by the controller 100 based on a sound signal, and accordingly the cover member 2 is vibrated based on the sound signal. Consequently, a reception signal is transmitted from the cover member 2 to the user. The volume of the reception sound can be set to a degree such that the user can hear the sound when moving the cover member 2 close to an ear. The reception sound transmitted from the cover member 2 to the user will be described below in detail.

The bonding material 260 for attaching the piezoelectric vibrating element 190 to the cover member 2 may be a double-sided tape or an adhesive. The double-sided tape used as the bonding material 260 is, for example, a double-sided tape that is impact resistant and strongly adhesive. Such a double-sided tape is, for example, a double-sided tape including a nonwoven fabric as a base material with an acrylic gluing agent provided on both side of the base material. The use of the bonding material 260 being a double-sided tape that is impact resistant and strongly adhesive can reduce the occurrence of breakage of the piezoelectric vibrating element 190 when the electronic apparatus 1 is dropped. Further, a vibration of the piezoelectric vibrating element 190 can be transmitted to the cover member 2 more easily. Consequently, the reception sound can be easily transmitted to the user from the cover member 2. The double-sided tape used as the bonding material 260 is not limited to the above example.

The battery 200 can output the power for the electronic apparatus 1. The power output from the battery 200 is supplied to the respective electronic components such as the controller 100 and the wireless communication unit 110 of the electronic apparatus 1.

<Details of Piezoelectric Vibrating Element>

Figure 7:
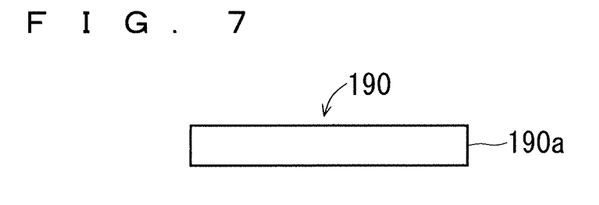
FIG. 7 illustrates a top view showing a structure of a piezoelectric vibrating element.
Figure 8:
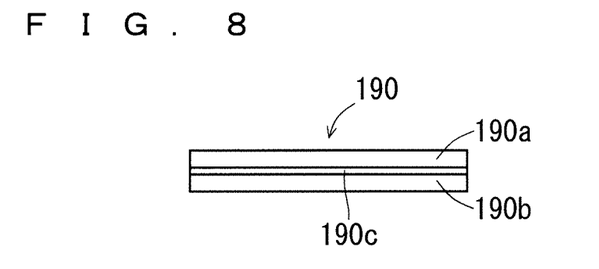
FIG. 8 illustrates a side view showing the structure of the piezoelectric vibrating element.

FIGS. 7 and 8 are a top view and a side view, respectively, illustrating a structure of the piezoelectric vibrating element 190. As illustrated in FIGS. 7 and 8, the piezoelectric vibrating element 190 has a long shape in one direction. Specifically, the piezoelectric vibrating element 190 has a long and narrow rectangular plate shape in a plan view. The piezoelectric vibrating element 190 has, for example, a bimorph structure. The piezoelectric vibrating element 190 includes a first piezoelectric ceramic plate 190a and a second piezoelectric ceramic plate 190b which are bonded to each other through a shim material 190c therebetween.

In the piezoelectric vibrating element 190, when a positive voltage is applied to the first piezoelectric ceramic plate 190a and a negative voltage is applied to the second piezoelectric ceramic plate 190b, the first piezoelectric ceramic plate 190a extends along the longitudinal direction and the second piezoelectric ceramic plate 190b contracts along the longitudinal direction. Accordingly, as illustrated in FIG. 9, the piezoelectric vibrating element 190 is bent into a convex with the first piezoelectric ceramic plate 190a being the outside.

In contrast, in the piezoelectric vibrating element 190, when a negative voltage is applied to the first piezoelectric ceramic plate 190a and a positive voltage is applied to the second piezoelectric ceramic plate 190b, the first piezoelectric ceramic plate 190a contracts along the longitudinal direction and the second piezoelectric ceramic plate 190b extends along the longitudinal direction. Accordingly, as illustrated in FIG. 10, the piezoelectric vibrating element 190 is bent into a convex with the second piezoelectric ceramic plate 190b being the outside.

Figure 9:
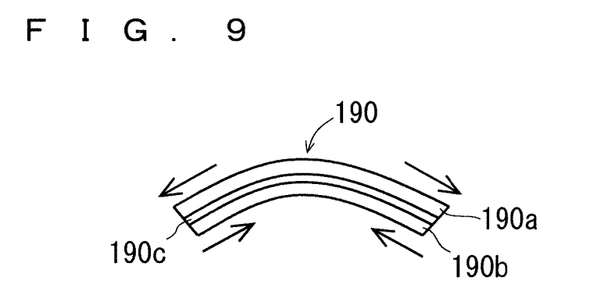
FIG. 9 illustrates how the piezoelectric vibrating element vibrates while being bent.
Figure 10:
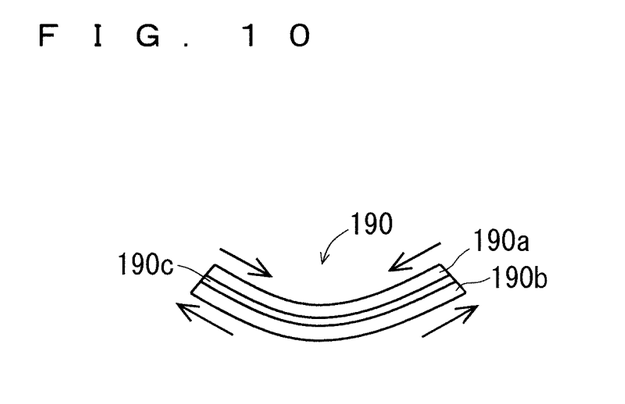
FIG. 10 illustrates how the piezoelectric vibrating element vibrates while being bent.

The piezoelectric vibrating element 190 vibrates while being bent by alternately taking the state of FIG. 9 and the state of FIG. 10. The controller 100 allows the piezoelectric vibrating element 190 to vibrate while being bent by applying an alternating current (AC) voltage in which a positive voltage and a negative voltage alternately appear at an area between the first piezoelectric ceramic plate 190a and the second piezoelectric ceramic plate 190b.

Only one structure made of the first piezoelectric ceramic plate 190a and the second piezoelectric ceramic plate 190b, which are bonded to each other with the shim material 190c therebetween, is provided in the piezoelectric vibrating element 190 illustrated in FIGS. 7 to 10. Alternatively, a plurality of the structures may be laminated to each other.

As illustrated in FIG. 5, the piezoelectric vibrating element 190 having such a structure is located on a peripheral end 211 of the inner surface 21 of the cover member 2. Specifically, the piezoelectric vibrating element 190 is located on a central portion in the horizontal direction (the short-length direction perpendicular to the longitudinal direction) of the upper end of the inner surface 21 of the cover member 2. As illustrated in FIG. 5, in a plan view seen from the inner surface 21 side of the cover member 2, the piezoelectric vibrating element 190 is located between the display panel 120 and a periphery 210 of the inner surface 21 of the cover member 2.

The longitudinal direction of the piezoelectric vibrating element 190 corresponds to the horizontal direction of the cover member 2. Further, the center of the piezoelectric vibrating element 190 in the longitudinal direction corresponds to the center in the horizontal direction of the upper end of the inner surface 21 of the cover member 2.

As illustrated in FIGS. 9 and 10 mentioned above, the center of the piezoelectric vibrating element 190 in the longitudinal direction has the largest displacement amount when the piezoelectric vibrating element 190 is vibrating while being bent. Accordingly, an area in the center in the horizontal direction of the upper end of the inner surface 21 of the cover member 2, which corresponds to the position of the piezoelectric vibrating element 190, has the largest displacement amount of bending and vibrating.

<Generation of Reception Sound>

In the electronic apparatus 1 according to one embodiment, the piezoelectric vibrating element 190 causes the cover member 2 to vibrate, so that the air conduction sound and the tissue conduction sound are transmitted from the cover member 2 to the user. In other words, a vibration of the piezoelectric vibrating element 190 itself is transmitted to the cover member 2, so that the air conduction sound and the tissue conduction sound are transmitted from the cover member 2 to the user.

Here, the term "air conduction sound" is a sound recognized in the human brain by the vibrations of an eardrum due to a sound wave (air vibration) which enters an external auditory meatus hole (a so-called "ear hole"). On the other hand, the term "tissue conduction sound" is a sound recognized in the human brain by the vibration of the eardrum due to the vibration of an auricle transmitted to the eardrum. Hereinafter, the air conduction sound and the tissue conduction sound will be described in detail.

Figure 11:
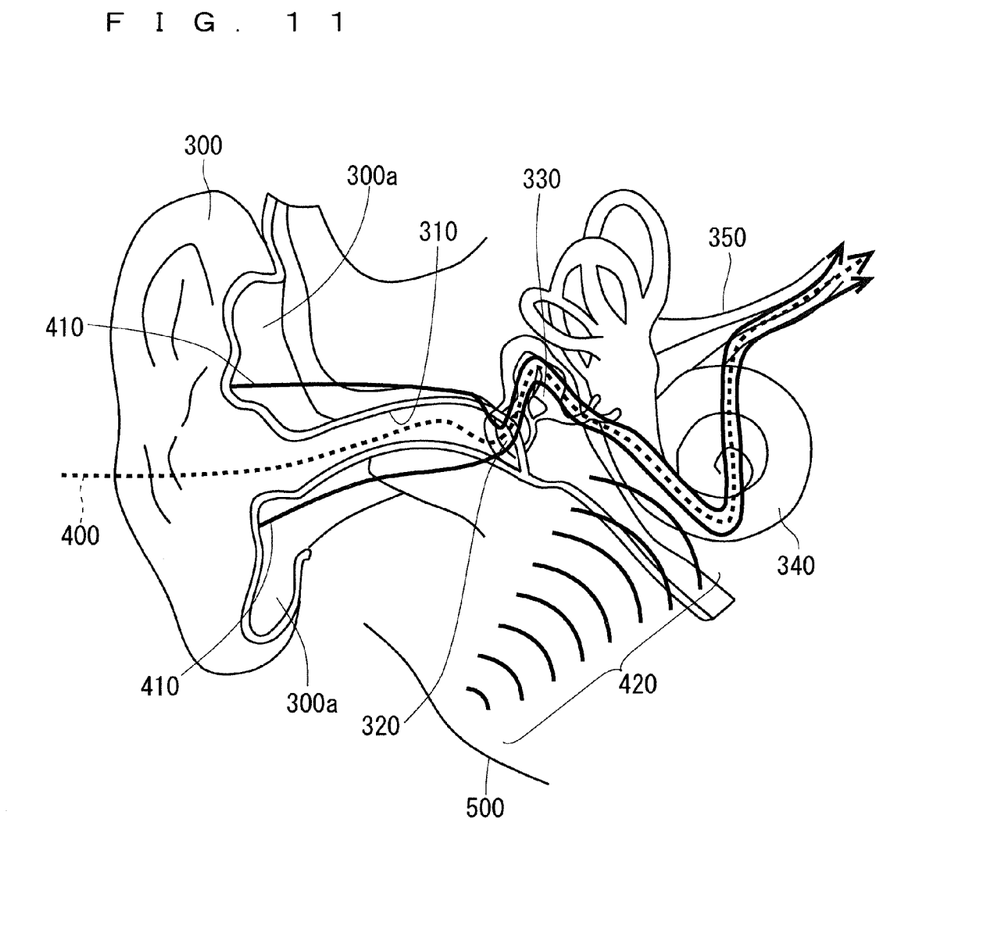
FIG. 11 illustrates a view for describing air conduction sound and tissue conduction sound.

FIG. 11 is a view for describing the air conduction sound and the tissue conduction sound. FIG. 11 illustrates the structure of the ear of the user of the electronic apparatus 1. In FIG. 11, a dotted line 400 indicates a conduction path of a sound signal (sound information) while the air conduction sound is recognized in the human brain. A solid line 410 indicates a conduction path of a sound signal while the tissue conduction sound is recognized in the human brain.

When the piezoelectric vibrating element 190 mounted on the cover member 2 vibrates based on the electric sound signal indicating the reception sound, the cover member 2 vibrates, and a sound wave is output from the cover member 2. When the user moves the cover member 2 of the electronic apparatus 1 to an auricle 300 of the user by holding the electronic apparatus 1 in a hand, or the cover member 2 of the electronic apparatus 1 is set to (brought into contact with) the auricle 300 of the user, the sound wave output from the cover member 2 enters an external auditory meatus hole 310. The sound wave from the cover member 2 travels through the external auditory meatus hole 310 and cause an eardrum 320 to vibrate. The vibration of the eardrum 320 is transmitted to an auditory ossicle 330 and the auditory ossicle 330 vibrates. In addition, the vibration of the auditory ossicle 330 is transmitted to a cochlea 340 and is converted into an electrical signal in the cochlea 340. The electrical signal is transmitted to the brain by passing through an acoustic nerve 350 and the reception sound is recognized in the brain. In this manner, the air conduction sound is transmitted from the cover member 2 to the user.

Further, when the user puts the cover member 2 of the electronic apparatus 1 to the auricle 300 of the user by holding the electronic apparatus 1 in a hand, the auricle 300 is vibrated by cover member 2, which is vibrated by the piezoelectric vibrating element 190. The vibration of the auricle 300 is transmitted to the eardrum 320, and thus the eardrum 320 vibrates. The vibration of the eardrum 320 is transmitted to the auditory ossicle 330, and thus the auditory ossicle 330 vibrates. The vibration of the auditory ossicle 330 is transmitted to the cochlea 340 and is converted into an electrical signal in the cochlea 340. The electrical signal is transmitted to the brain though the acoustic nerve 350 and the reception sound is recognized in the brain. In this manner, the tissue conduction sound is transmitted from the cover member 2 to the user. FIG. 11 illustrates an auricle cartilage 300a in the inside of the auricle 300.

Bone conduction sound is a sound recognized in the human brain by the vibration of the skull and direct stimulation of the inner ear such as the cochlea caused by the vibration of the skull. In FIG. 11, in a case where a jawbone 500 vibrates, the transmission path of the sound signal while the bone conduction sound is recognized in the brain is indicated by a plurality of arcs 420.

As described above, in one embodiment, the air conduction sound and the tissue conduction sound can be transmitted from the cover member 2 to the user of the electronic apparatus 1 due to an appropriate vibration of the cover member 2 through the vibration of the piezoelectric vibrating element 190. The user can hear the air conduction sound from the cover member 2 by moving the cover member 2 close to an ear (auricle). Further, the user can hear the air conduction sound and the tissue conduction sound from the cover member 2 by bringing the cover member 2 into contact with an ear (auricle). The structure of the piezoelectric vibrating element 190 according to one embodiment is contrived to appropriately transmit the air conduction sound and the tissue conduction sound to the user. Various advantages are achieved by configuring the electronic apparatus 1 to transmit the air conduction sound and the tissue conduction sound to the user.

Since the user can hear a sound when putting the cover member 2 to the ear, communication using the electronic apparatus 1 can be performed without much concerning of the position of the electronic apparatus 1 with respect to the ear.

If there is a large amount of ambient noise, the user can make it difficult to hear the ambient sound by strongly putting the cover member 2 to the ear while turning up the volume of the tissue conduction sound. Accordingly, the user can appropriately perform communication even when there is a large amount of the ambient noise.

In addition, even with earplugs or earphones on his/her ears, the user can recognize the reception sound from the electronic apparatus 1 by putting the cover member 2 to the ear (more specifically, the auricle). Further, even with headphones on his/her ears, the user can recognize the reception sound from the electronic apparatus 1 by putting the cover member 2 to the headphones.

The portion of the cover member 2, on which the piezoelectric vibrating element 190 is mounted, vibrates relatively easily. Thus, the user can hear the sound from the cover member 2 by moving the upper end (particularly, a central portion in the horizontal direction of the upper end) of the cover member 2, on which the piezoelectric vibrating element 190 is mounted, close to the ear or putting the portion to the ear.

<How to Attach Cover Member and Housing>

In one embodiment, the cover member 2 and the housing 3 are bonded to each other with a bonding material 600 such that the cover member 2 and the housing 3 are attached. When the cover member 2 and the housing 3 are attached, for example, the bonding material 600 is disposed on the inner surface 21 of the cover member 2. Then, the inner surface 21 of the cover member 2 is attached to the housing 3 with the bonding material 600 therebetween. Alternatively, the bonding material 600 may be disposed on the surface of the housing 3 to which the cover member 2 is to be attached, and then the inner surface 21 of the cover member 2 may be attached to the relevant surface of the housing 3 with the bonding material 600 therebetween.

The bonding material 600 may be a double-sided tape or an adhesive. In a case where the electronic apparatus 1 is made waterproof, a waterproof double-sided tape or a waterproof adhesive is used as the bonding material 600. The waterproof double-sided tape is, for example, a double-sided tape including a foam material as a base material with an acrylic gluing agent being provided on both sides of the base material. The waterproof adhesive is, for example, an adhesive made of thermosetting resin. The waterproof double-sided tape and the waterproof adhesive are not limited to above examples.

Figure 12:
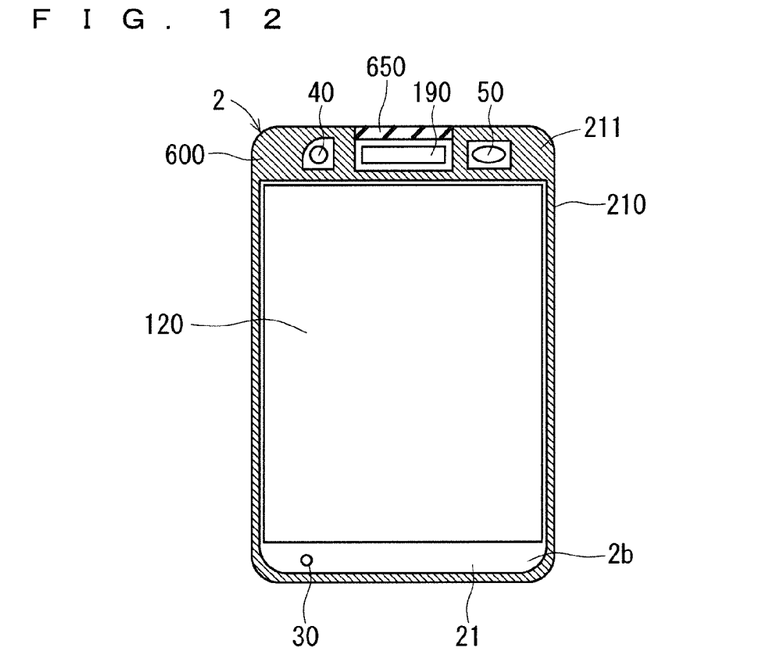
FIG. 12 illustrates a plan view showing the cover member when seen from its inner surface side.
Figure 13:
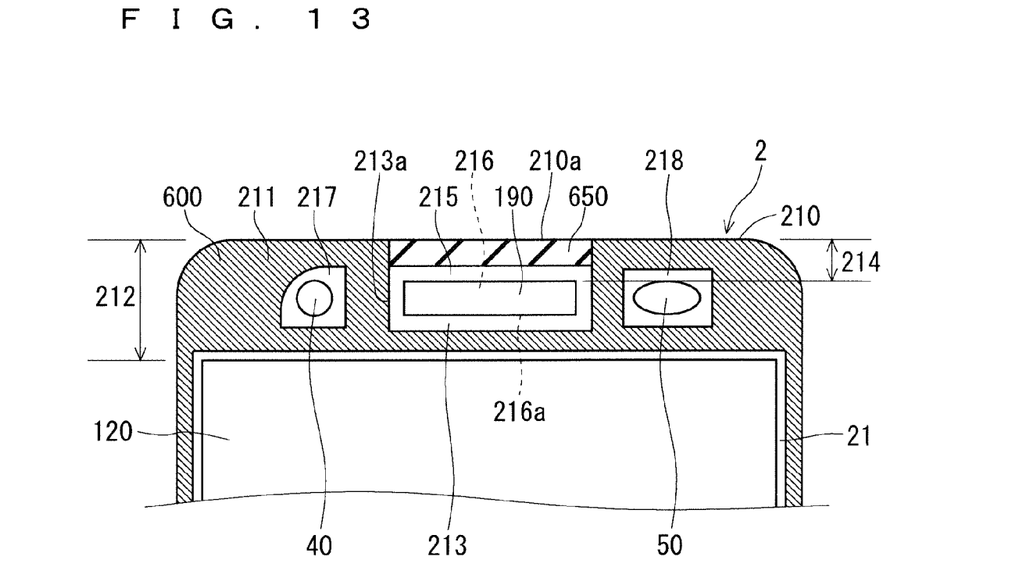
FIG. 13 illustrates a partially-enlarged view showing the cover member when seen from its inner surface side.
Figure 14:
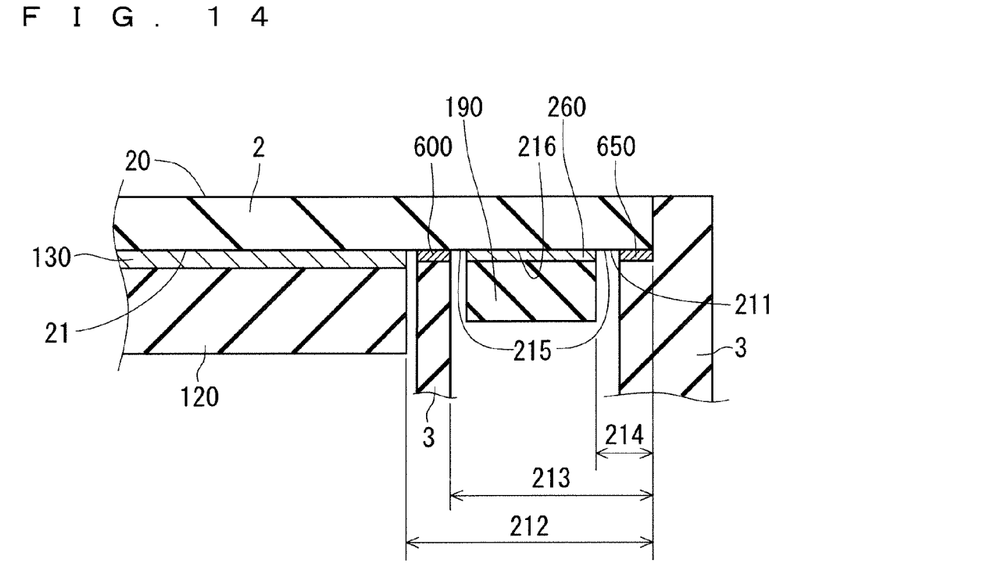
FIG. 14 illustrates a partially-enlarged view of the peripheral end 2b in FIG. 4, showing the sectional structure of the peripheral end 2b of the electronic apparatus according to an embodiment.

FIG. 12 is a plan view showing the cover member 2 when seen from the inner surface 21 side with the cover member 2 being detached from the housing 3. FIG. 13 is a partially enlarged view of the structure illustrated in FIG. 12. In FIGS. 12 and 13, the bonding material 600 is hatched by oblique lines that slope down to the right. Thus, the region, which is hatched by the oblique lines that slope down to the right, of the inner surface 21 of the cover member 2 is attached to the housing 3. In FIGS. 12 and 13, an intervening member 650, which will be described below, is hatched by oblique lines that slope down to the left. FIG. 14 is an enlarged view showing the sectional structure illustrated in FIG. 4 at and around the piezoelectric vibrating element 190. FIG. 14 illustrates the sectional structure of the electronic apparatus 1 in a sideways position with the upper end of the electronic apparatus 1 being located on the right side.

As illustrated in FIGS. 12 and 13, the bonding material 600 is located on the peripheral end (peripheral portion) 211 of the inner surface 21 of the cover member 2. Thus, while the inner surface 21 of the cover member 2 is attached to the housing 3, the bonding material 600 is located between the housing 3 and the peripheral end 211 of the inner surface 21 of the cover member 2. As illustrated in FIG. 12, the bonding material 600 is located on the peripheral end 211 of the inner surface 21 so as to surround the perimeter of the display panel 120 in a plan view when the cover member 2 is seen from the inner surface 21 side.

In one embodiment, the imaging lens of the front imaging unit 160 is attached to the front-surface-lens transparent part 40 of the cover member 2 from its inner side, and accordingly the bonding material 600 is not provided in the region in which the front-surface-lens transparent part 40 is formed and on a ring-shaped adjacent region 217 that is adjacent to the perimeter of the relevant region of the inner surface 21 of the cover member 2. The proximity sensor 140 is attached to the proximity-sensor transparent part 50 of the cover member 2 from its inner side, and accordingly the bonding material 600 is not provided in the region in which the proximity-sensor transparent member 50 is formed and on an adjacent region 218 that is adjacent to the perimeter of the relevant region of the inner surface 21 of the cover member 2.

In one embodiment, a first region 212 of the inner surface 21 of the cover member 2 on the piezoelectric vibrating element 190 side relative to the display panel 120 includes a second region 213 in which the bonding material 600 is absent, the second region 213 including a region 216 in which the piezoelectric vibrating element 190 is located and extending to one part 210a of the periphery 210 of the inner surface 21. The intervening member 650 that is less likely to interfere with the vibration of the cover member 2 than the bonding material 600 is located on a third region 214 in the second region 213 that is close to the one part 210a of the periphery 210 relative to the piezoelectric vibrating element 190. That is, the intervening member 650 is located between the housing 3 and the third region 214 of the inner surface 21 of the cover member 2.

In one embodiment, the first region 212 is the upper end of the inner surface 21 of the cover member 2. The second region 213 includes the region 216, in which the piezoelectric vibrating element 190 is disposed, in such a manner that an outline 213a of the second region 213 is not in contact with the entirety of an outline 216a of the region 216. The second region 213 extends to a part of the upper edge of the inner surface 21. The third region 214 is the region in the second region 213 above the piezoelectric vibrating element 190. The third region 214 extends to a part of the upper edge of the inner surface 21.

In one embodiment, the intervening member 650 extends in the third region 214 from the one part 210a of the periphery 210 of the inner surface 21 (a part of the upper edge of the inner surface 21) toward the piezoelectric vibrating element 190 in such a manner that the intervening member 650 is not in contact with the piezoelectric vibrating element 190. In the second region 213 of the inner surface 21, the intervening member 650 as well as the bonding material 600 are absent in a ring-shaped adjacent region 215 adjacent to the entirety of the region 216 in which the piezoelectric vibrating element 190 is disposed.

The intervening member 650 may be a member that is softer than the bonding material 600. The intervening member 650 is, for example, a member including a cushioning material (elastic material) with a double-sided tape being attached to both sides of the cushioning material. The intervening member 650 is bonded to the inner surface 21 of the cover member 2 with the double-sided tape attached to one surface of the cushioning material. Then, the intervening member 650 is bonded to the inner surface of the housing 3 with the double-sided tape attached to another surface of the cushioning material.

The cushioning material included in the intervening member 650 is, for example, a foam material. The foam material is, for example, a polyolefin foam material, a polyester foam material, or a urethane foam material. The double-sided tape included in the intervening member 650 is, for example, a double-sided tape in which an acrylic gluing agent is provided on both side of the base material made of polyester.

As illustrated in FIGS. 12 and 13, the intervening member 650 is located in the vicinity of the one part 210a of the periphery 210 of the inner surface 21 of the cover member 2 and the bonding material 600 is located in the vicinity of the entirety of the remaining part, except the one part 210a, of the periphery 210. Every portion in the vicinity of the periphery 210 of the inner surface 21 of the cover member 2 (herein also referred to as a "periphery neighboring region of the inner surface 21") is provided with the bonding material 600 or the intervening member 650, leaving no space along the periphery 210.

As described above, in one embodiment, the cover member 2 is attached to the housing 3 with the bonding material 600 such as a double-sided tape or an adhesive, and accordingly the bonding material 600 can interfere with the vibration of cover member 2 to some extent.

Figure 15:
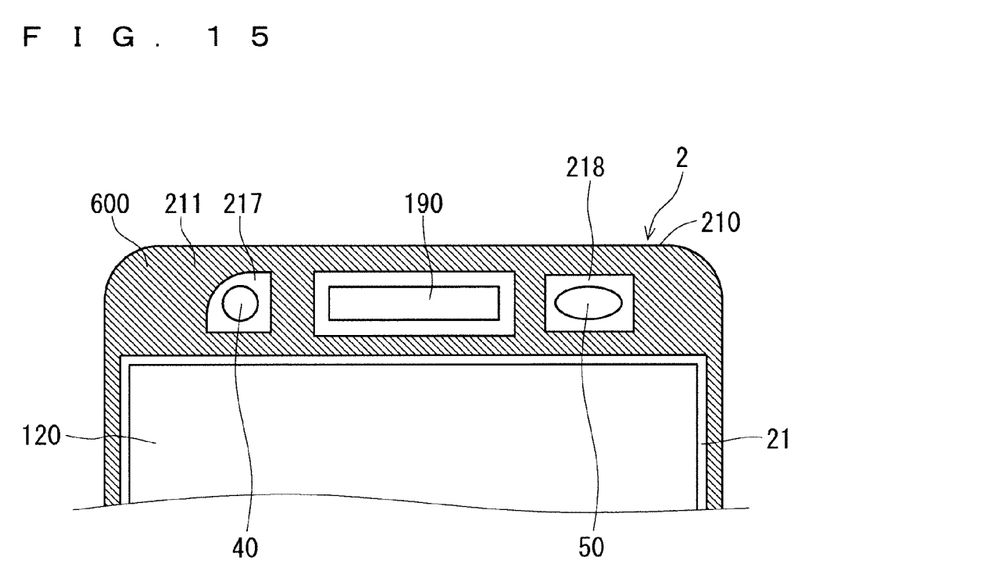
FIG. 15 illustrates a plan view showing a cover member of an electronic apparatus for comparison with the electronic apparatus according to an embodiment when seen from its inner surface side.

Assume that every portion of the periphery neighboring region of the inner surface 21 of the cover member 2 is provided with the bonding material 600, leaving no space along the periphery 210. In this case, as illustrated in FIG. 15, the portion of the periphery neighboring region of the inner surface 21 close to the piezoelectric vibrating element 190 is provided with the bonding material 600. That is, the portion of the periphery neighboring region of the inner surface 21 close to the piezoelectric vibrating element 190 is attached to the housing 3 with the bonding material 600. Thus, the portion of the cover member 2 in the vicinity of the piezoelectric vibrating element 190 cannot vibrate easily.

In contrast to this, in the electronic apparatus 1 according to one embodiment, the first region 212 of the inner surface 21 of the cover member 2 on the piezoelectric vibrating element 190 side relative to the display panel 120 includes the second region 213 in which the bonding material 600 is absent, the second region 213 including the region in which the piezoelectric vibrating element 190 is located and extending to the one part 210a of the periphery 210 of the inner surface 21. The piezoelectric vibrating element 190 is located in the second region 213 in which the bonding material 600 is absent, the second region 213 extending to the periphery 210 of the inner surface 21 of the cover member 2. Unlikely to the case illustrated in FIG. 15, the part (the second region 213) of the cover member 2 in the vicinity of the piezoelectric vibrating element 190 vibrates easily. Consequently, the sound from the electronic apparatus 1 can be easily transmitted to the user.

Further, in one embodiment, the intervening member 650 that is less likely to interfere with the vibration of the cover member 2 than the bonding material 600 is located between the housing 3 and the third region 214 in the second region 213 that is close to the one part 210a of the periphery 210 relative to the piezoelectric vibrating element 190. The intervening member 650 that is less likely to interfere with the vibration of the cover member 2 than the bonding material 600 is provided as described above, which allows the portion of the cover member 2 in the vicinity of the piezoelectric vibrating element 190 to vibrate easily and eliminates or reduces the entry of dust and the like into the electronic apparatus 1 from the outside.

As in one embodiment, the intervening member 650 including the cushioning material reduces the occurrence of breakage of the cover member 2 and the housing 3, for example, when the electronic apparatus 1 is dropped.

Various Modifications

First Modification

Only one surface of the cushioning material in the intervening member 650 may be provided with a double-sided tape, and then the intervening member 650 may be attached to the inner surface 21 of the cover member 2 with the double-sided tape. In this case, the contact surface of the intervening member 650 in contact with the housing 3 is not fixed to the housing 3. Thus, the portion of the cover member 2 to which the intervening member 650 is attached is allowed to move easily, and accordingly, the portion of the cover member 2 in the vicinity of the piezoelectric vibrating element 190 is allowed to vibrate more easily. Thus, the sound from the electronic apparatus 1 can be transmitted to the user more easily.

Alternatively, only one surface of the cushioning material in the intervening material 650 may be provided with a double-sided tape, and then the intervening material 650 may be attached to the inner surface of the housing 3 with the double-sided tape. In this case, the contact surface of the intervening member 650 in contact with the cover member 2 is not fixed to the cover member 2. Thus, the portion of the cover member 2 that is in contact with the intervening member 650 is allowed to move easily, and accordingly the portion of the cover member 2 in the vicinity of the piezoelectric vibrating element 190 is allowed to vibrate more easily. Consequently, the sound from the electronic apparatus 1 can be transmitted to the user more easily.

Second Modification

Figure 16:
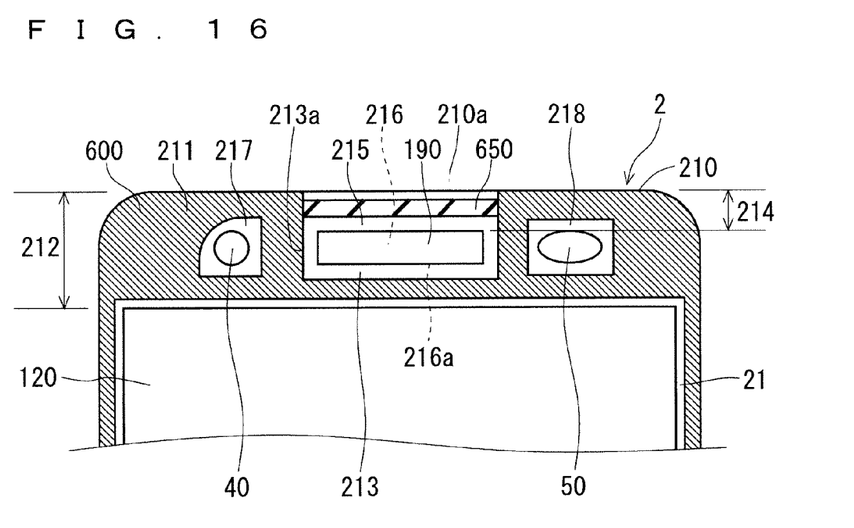
FIG. 16 illustrates a partially-enlarged view showing a cover member of an electronic apparatus according to a modification when seen from its inner surface side.

In one example mentioned above, the intervening member 650 located between the cover member 2 and the housing 3 extends to the periphery 210 of the inner surface 21 of the cover member 2. Alternatively, as illustrated in FIG. 16, the intervening member 650 does not necessarily extend to the periphery 210 of the inner surface 21 of the cover member 2. This still eliminates or reduces the entry of dust and the like into the electronic apparatus 1 from the outside while the portion of the cover member 2 in the vicinity of the piezoelectric vibrating element 190 is allowed to vibrate easily.

Third Modification

Figure 17:
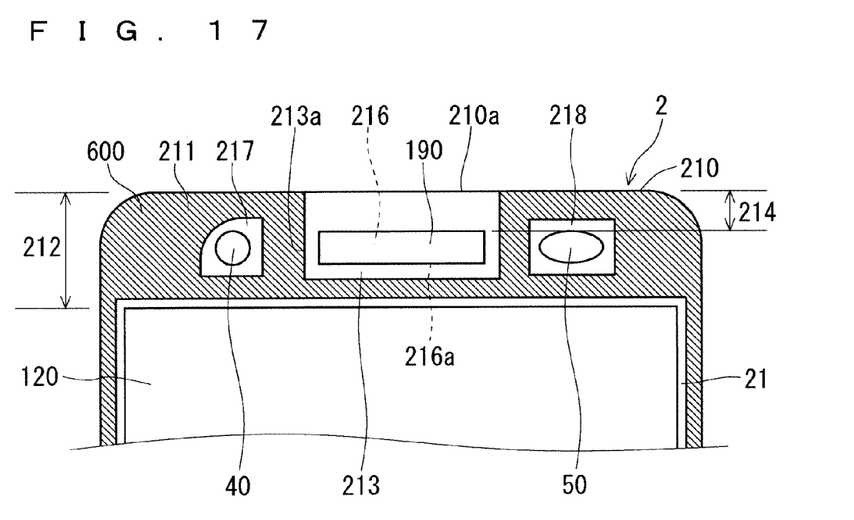
FIG. 17 illustrates a partially-enlarged view showing the cover member of the electronic apparatus according to a modification when seen from its inner surface side.
Figure 18:
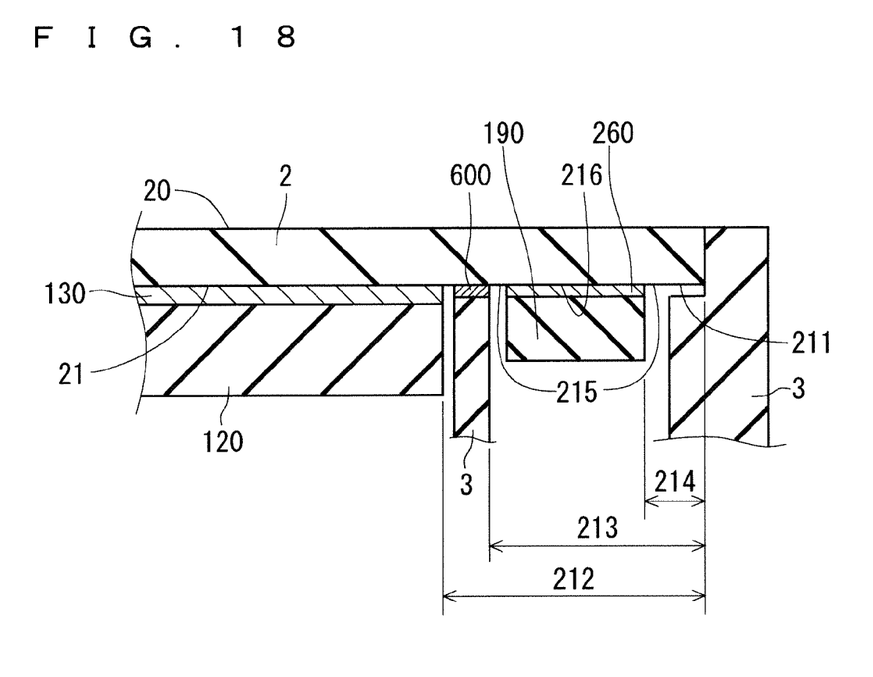
FIG. 18 illustrates a partially-enlarged view showing a sectional structure of the electronic apparatus according to a modification.

FIG. 17 is a partially-enlarged plan view showing the cover member 2 of the electronic apparatus 1 according to one modification when seen from the inner surface 21 side. FIG. 17 illustrates a part of the cover member 2 when seen from the inner surface 21 side with the cover member 2 being detached from the housing 3. FIG. 18 illustrates a partially-enlarged sectional structure of the electronic apparatus 1 according to one modification.

As illustrated in FIGS. 17 and 18, the electronic apparatus 1 according to one modification does not include the intervening member 650 mentioned above, and thus the intervening member 650 is absent in the second region 213 of the inner surface 21 of the cover member 2. The housing 3 and the third region 214 of the inner surface 21 of the cover member 2 include nothing located therebetween. Although the electronic apparatus 1 is more likely to allow the entry of dust and the like from the outside, the portion (the second region 213) of the cover member 2 in the vicinity of the piezoelectric vibrating element 190 vibrates more easily. Thus, the sound from the electronic apparatus 1 can be transmitted to the user more easily.

Figure 19:
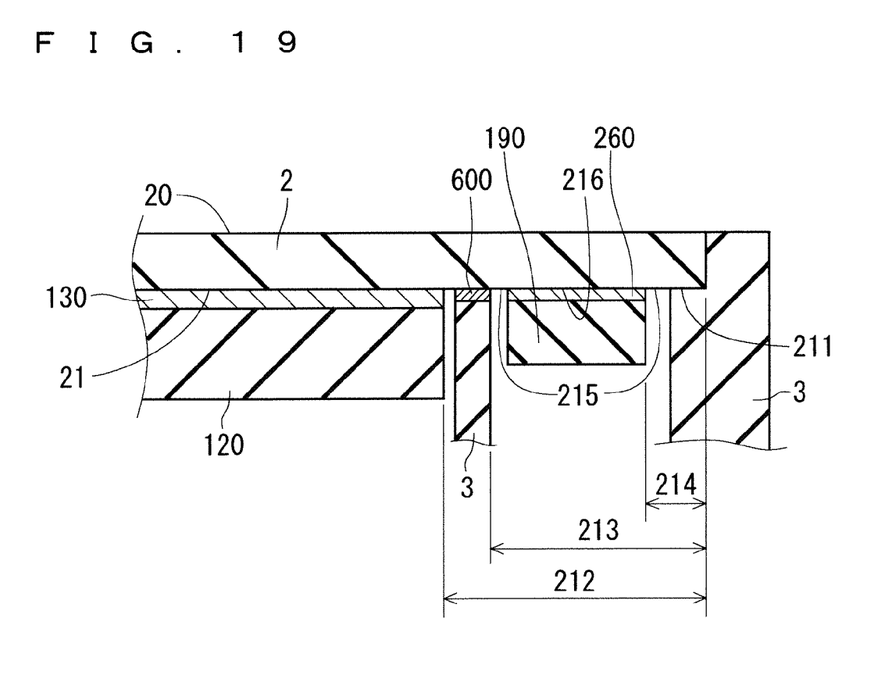
FIG. 19 illustrates a partially-enlarged view showing a sectional structure of the electronic apparatus according to a modification.

In one example illustrated in FIG. 18, the housing 3 and the third region 214 of the inner surface 21 of the cover member 2 are not in contact with each other. Alternatively, the housing 3 and the third region 214 may be in contact with each other as illustrated in FIG. 19. In comparison with the case illustrated in FIG. 19, in a case where the housing 3 and the third region 214 of the inner surface 21 of the cover member 2 are not in contact with each other as illustrated in FIG. 18, the portion (the second region 213) of the cover member 2 in the vicinity of the piezoelectric vibrating element 190 vibrates more easily. Meanwhile, in comparison with the case illustrated in FIG. 18, in a case where the housing 3 and the third region 214 of the inner surface 21 of the cover member 2 are in contact with each other as illustrated in FIG. 19, the electronic apparatus 1 is less likely to allow the entry of dust and the like from the outside.

In the above description, although embodiments of the present disclosure are applied to mobile phones, embodiments of the present disclosure are also applicable to other electronic apparatuses in addition to the mobile phones.

In the above description, the electronic apparatus 1 is described in detail, but the above description is the exemplification in all aspects and embodiments of the present disclosure are not intended to be limited thereto. In addition, various examples described above are applicable in combination as long as they are not mutually inconsistent. And, it is construed that numerous modifications which are not exemplified can be envisaged without departing from the scope of the present disclosure.

The invention claimed is:

1. An electronic apparatus comprising:
a display;
a cover member that is located on a surface of the electronic apparatus and is configured to cover a display surface of the display;
a housing, wherein the housing comprises a protrusion from an inner surface of the housing that is opposite the cover member, wherein the protrusion is bonded by a bonding material to an inner surface of the cover member at a position between the display and an edge of the cover member in a plan view, and wherein the inner surface of the cover member includes a partial region, between the bonded protrusion of the housing and the edge of the cover member, in which the bonding material is absent;
a piezoelectric vibrating element that is located in the partial region of the inner surface of the cover member between the bonded protrusion of the housing and the edge of the cover member in the plan view;
a controller configured to cause the piezoelectric vibrating element to vibrate based on a sound signal; and
an intervening member that is located in the partial region of the inner surface of the cover member on an opposite side of the piezoelectric vibrating element than the bonded protrusion of the housing in the plan view, wherein the intervening member is less likely to interfere with a vibration of the cover member than the bonding material.

2. The electronic apparatus according to claim 1, wherein the intervening member includes a cushioning material.

3. The electronic apparatus according to claim 2, wherein the cushioning material is a foam material.

4. The electronic apparatus according to claim 1, wherein a contact surface of the intervening member in contact with the housing is not fixed to the housing.

5. The electronic apparatus according to claim 1, wherein a contact surface of the intervening member in contact with the cover member is not fixed to the cover member.

6. The electronic apparatus according to claim 1, wherein the piezoelectric vibrating element causes the cover member to vibrate such that air conduction sound and tissue conduction sound are transmitted to a user from the cover member.

* * * * *